(12) United States Patent
Kosugi et al.

(10) Patent No.: US 6,426,508 B1
(45) Date of Patent: Jul. 30, 2002

(54) SURFACE-POSITION DETECTION DEVICE, A PROJECTION EXPOSURE APPARATUS USING THE DEVICE, AND A DEVICE MANUFACTURING METHOD USING THE APPARATUS

(75) Inventors: Yuji Kosugi; Yuichi Yamada, both of Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/345,502

(22) Filed: Jul. 1, 1999

(30) Foreign Application Priority Data

Jul. 6, 1998 (JP) .......................................... 10-205901

(51) Int. Cl.[7] .............................................. G01N 21/86
(52) U.S. Cl. ......................... 250/548; 356/399; 355/53
(58) Field of Search ......................... 250/548; 356/399, 356/400, 401; 355/53

(56) References Cited

U.S. PATENT DOCUMENTS

| | | | | |
|---|---|---|---|---|
| 5,118,957 A | * | 6/1992 | Kawashima et al. | ........ 250/561 |
| 5,162,642 A | * | 11/1992 | Akamatsu et al. | ........ 250/201.6 |
| 5,602,399 A | * | 2/1997 | Mizutani | ..................... 250/548 |
| 5,602,400 A | * | 2/1997 | Kawashima | ................. 250/548 |
| 5,834,767 A | * | 11/1998 | Hasegawa et al. | .......... 250/237 |
| 5,969,820 A | * | 10/1999 | Yoshii et al. | ................ 356/375 |
| 6,002,487 A | * | 12/1999 | Shirata | ......................... 356/400 |
| 6,023,320 A | * | 2/2000 | Kawashima | .................. 356/52 |

* cited by examiner

*Primary Examiner*—Stephone B. Allen
(74) *Attorney, Agent, or Firm*—Fitzpatrick, Cella, Harper & Scinto

(57) ABSTRACT

A position detection device for detecting position information of a photosensitive substrate when performing projection exposure of a pattern on a surface of an object onto the photosensitive substrate, via a projection optical system, by scanning the pattern includes a device for detecting the position information within a shot region of the photosensitive substrate in the projection optical system, and a device for causing the detection device to detect the position information at a plurality of points arranged so that a first end of the plurality of points coincides with a position to start a scanning exposure and a second end of the plurality of points coincides with a position to end the scanning exposure, in accordance with a size of the shot region.

49 Claims, 7 Drawing Sheets

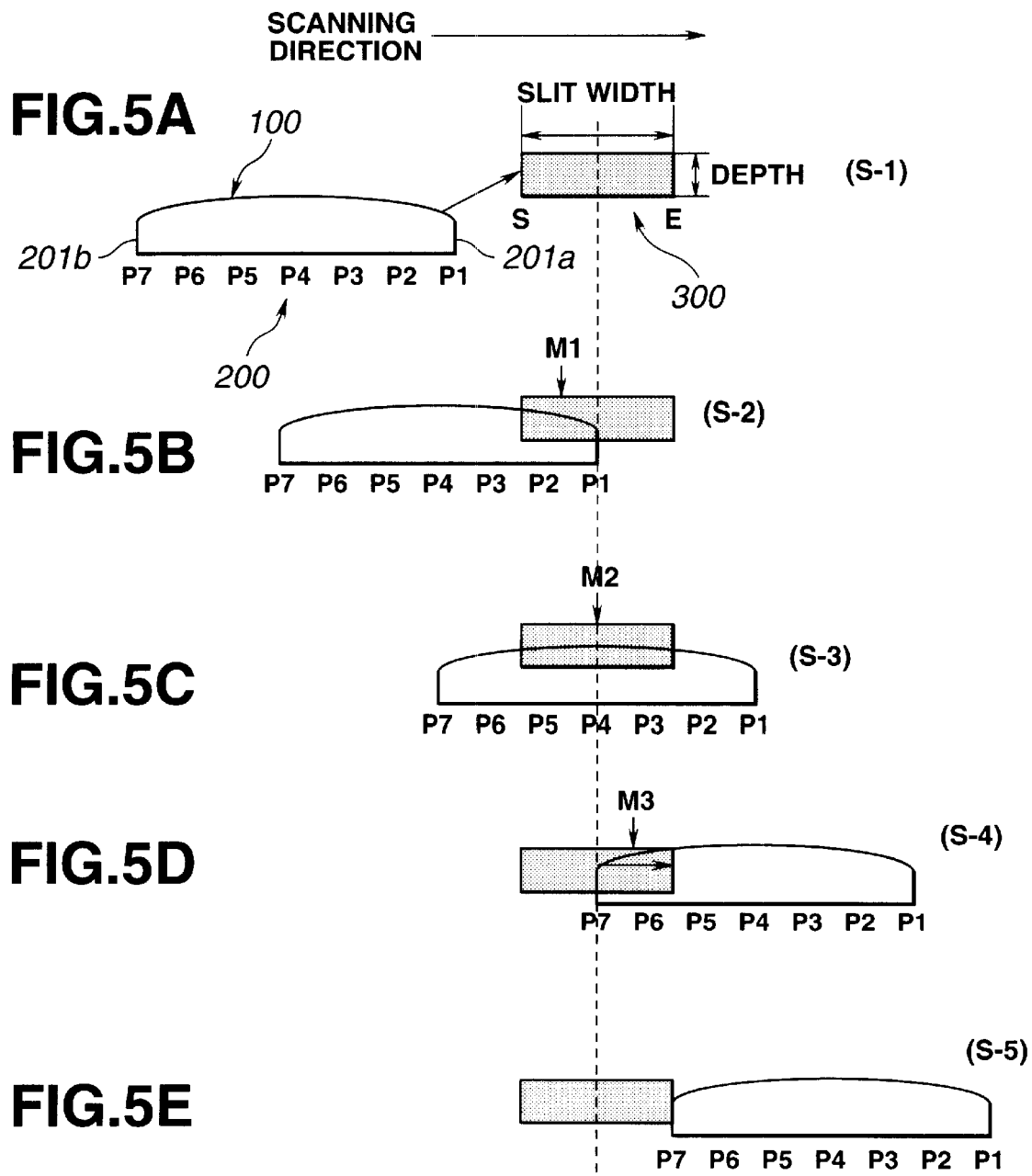

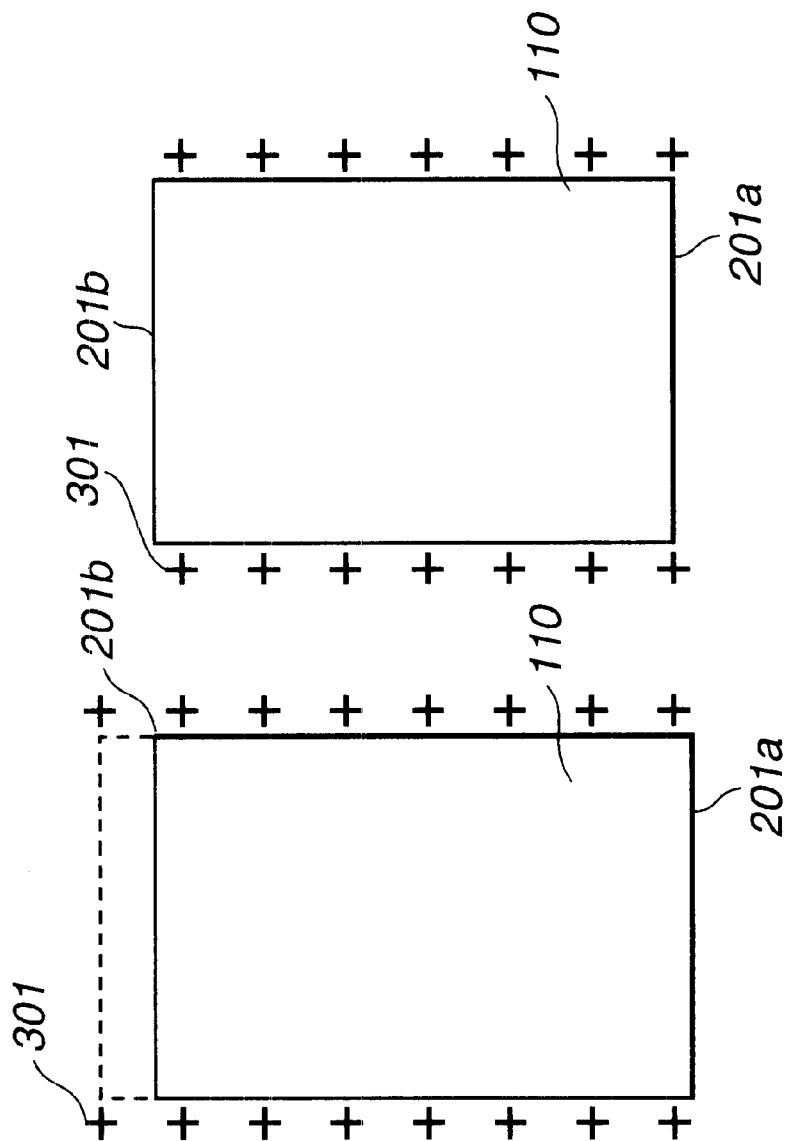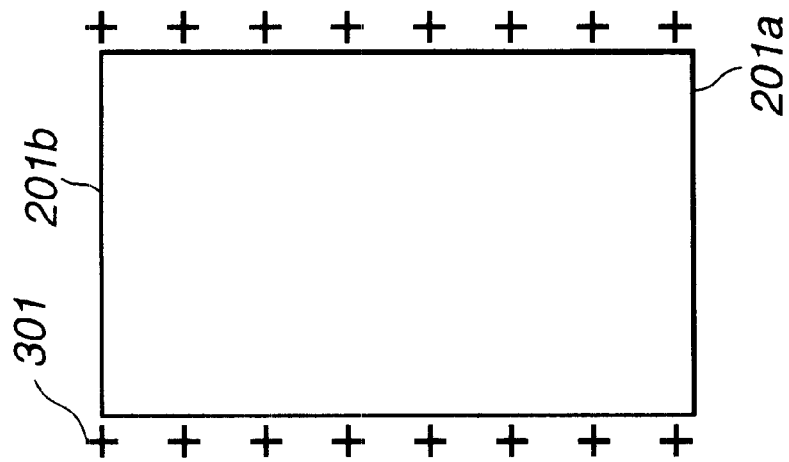

SURFACE-POSITION DETECTION DEVICE, A PROJECTION EXPOSURE APPARATUS USING THE DEVICE, AND A DEVICE MANUFACTURING METHOD USING THE APPARATUS

BACKGROUND OF THE INVENTION

1. Field of the Invention

The present invention relates to a surface-position detection device and a scanning projection exposure apparatus using the device. More particularly, the invention precisely and easily adjusts each exposure region of a semiconductor wafer (substrate) mounted on a wafer stage to a focal plane of a projection lens system (projection optical system) in a step-and-repeat or step-and-scan projection exposure apparatus for manufacturing semiconductor devices.

2. Description of the Related Art

At present, circuit patterns are becoming finer as the degree of integration of super LSIs (large-scale integrated circuits) increases, so that projection lens systems used in respective projection exposure apparatuses tend to have larger NAs (numerical apertures). As a result, allowable focal depths of respective lens systems in a circuit-pattern transfer process are becoming smaller. In addition, the sizes of areas to be exposed by projection lens systems are becoming larger.

Accordingly, in order to realize excellent transfer of a circuit pattern over the entire large-size region to be exposed, it is necessary to accurately position the entire region (shot) to be exposed of a wafer within the allowable focal depth of the projection lens system.

For that purpose, it is important to precisely detect the position and inclination of the surface of a wafer with respect to the focal plane, i.e., the plane where the image of a circuit, pattern on a reticle is focused, of a projection lens system, and adjust the position and inclination of the surface of the wafer.

Recently, there is an increasing demand for a scanning projection exposure apparatus which can increase an exposure region and an NA while using a projection lens equivalent to that used in a stepper.

In such a scanning exposure apparatus, in order to realize excellent transfer of a circuit pattern of a reticle over the entire region to be exposed, the position and inclination of the surface of a wafer, on which the circuit pattern is to be transferred, with respect to the image of the circuit pattern (the focal plane of the projection optical system) are precisely detected in synchronization with a scanning operation, and the surface of the wafer is sequentially adjusted to the optimum imaging surface of the projection optical system by continuously performing correction driving of auto-focus/auto-leveling during scanning exposure.

For example, a method using a detection optical system in which a light beam is projected from an oblique direction onto the surface of a wafer, and deviation in a reflection point of reflected light from the surface of the wafer is detected as deviation of reflected light on a sensor, and a method in which a plurality of positions on the surface of the wafer are detected using a gap sensor, such as an air microsensor, an electrostatic capacity sensor, or the like, and the surface position of the wafer is obtained based on the result of the detection are known as methods for detecting the height and the position of the surface of the wafer in the above-described exposure apparatus.

In a surface-position detection method in a scanning projection exposure apparatus in which the height of a wafer is continuously detected by performing relative scanning, in consideration of ease of control, positions to be measured are arranged, taking a point of start of exposure as a reference point, by (1) obtaining the minimum control frequency in the entire surface-position detection system from (a) the detection region of a measuring sensor, (b) a sampling period corresponding to the synchronizing scanning speed during exposure and the residual vibration mode of the structure of the apparatus, and (c) the control frequency of a control system, and (2) setting a constant sampling period based on the minimum control frequency.

In actual production facilities, however, chips having various sizes are produced using shrinked plates, cut-down plates, and the like, because various finer chips are demanded. Hence, in the above-described arrangement of sampling points to be measured depending on the control system, surface-position information is uncertain at peripheral portions, particularly at a portion near the position of an end of exposure by an amount within a fixed sampling interval, resulting in the generation of local defocus.

SUMMARY OF THE INVENTION

It is an object of the present invention to provide a surface-position detection device which can precisely adjust a wafer or a photosensitive substrate to a focal plane of a projection optical system even when the size of a shot changes, a projection exposure apparatus using the device, and a device manufacturing method using the apparatus.

According to one aspect of the present invention, a surface-position detection device for detecting surface-position information of a photosensitive plate disposed near an imaging surface of a projection optical system when performing projection exposure of a pattern on a surface of an object onto the photosensitive substrate via the projection optical system by performing relative scanning between the photosensitive substrate and the object includes detection means for detecting the surface-position information within a shot region of the photosensitive substrate in a direction of an optical axis of the projection optical system, and means for causing the detection means to detect the surface-position information at a plurality of points arranged so that a first end of the plurality of points coincides with a position to start a scanning exposure and a second end of the plurality of points coincides with a position to end the scanning exposure in accordance with a size of the shot region.

In one embodiment, an interval between adjacent points of the plurality of points is variable in accordance with a length of the scanning exposure in each shot region of the photosensitive substrate.

In another embodiment, the plurality of points are arranged with a substantially equal interval making the position to start a scanning exposure substantially equivalent to the first end and the position to end the scanning exposure substantially equivalent to the second end.

In still another embodiment, the size of the shot region is individually obtained in advance for each shot region from layout information of a region to be exposed on the photosensitive substrate.

According to another aspect of the present invention, a surface-position detection device for detecting surface-position information of a wafer when performing projection exposure of a pattern on a surface of a reticle onto the wafer via a projection optical system by performing relative scanning between the wafer and the reticle includes detection means for continuously detecting the surface-position information within a shot region of the wafer in a direction of an optical axis of the projection optical system, and means for causing the detection means to detect the surface-position information at a plurality of points arranged so that a first end of the plurality of points coincides with a position to start a scanning exposure and a second end of the plurality of points coincides with a position to end the scanning exposure in accordance with a size of the shot region.

In one embodiment, the surface-position information comprises inclination of the wafer with respect to a plane perpendicular to the direction of the optical axis of the projection optical axis.

In another embodiment, an interval between adjacent points of the plurality of points is variable in accordance with a length of the scanning exposure in each shot region within the wafer.

In still another embodiment, the plurality of points are arranged with a substantially equal interval making the position to start a scanning exposure substantially equivalent to the first end and the position to end the scanning exposure substantially equivalent to the second end.

In yet another embodiment, the size of the shot region is individually obtained in advance for each shot region from layout information of a region to be exposed on the wafer.

According to still another aspect of the present invention, a scanning projection exposure apparatus for performing projection exposure of a pattern on a surface of an object onto a shot region on a surface of a photosensitive substrate mounted on a movable stage by a projection optical system while causing scanning means to perform scanning between the object and the movable stage by causing the object and the movable stage to be synchronized with a velocity ratio corresponding to a photographing magnification of the projection optical system includes detection means for detecting surface-position information within a shot region of the photosensitive substrate in a direction of an optical axis of the projection optical system, and means for causing the detection means to detect the surface-position information at a plurality of points arranged so that a first end of the plurality of points coincides with a position to start a scanning exposure and a second end of the plurality of points coincides with a position to end the scanning exposure in accordance with a size of the shot region.

In one embodiment, an interval between adjacent points of the plurality of points is variable in accordance with a length of the scanning exposure in each shot region of the photosensitive substrate.

In another embodiment, the plurality of points are arranged with a substantially equal interval making the position to start a scanning exposure substantially equivalent to the first end and the position to end the scanning exposure substantially equivalent to the second end.

In still another embodiment, the size of the shot region is individually obtained in advance for each shot region from layout information of a region to be exposed on the photosensitive substrate.

In yet another embodiment, a position of the shot region being subjected to projection exposure in the direction of the optical axis is corrected based on the surface-position information.

In yet a further embodiment, in the correction of the position of the shot region in the direction of the optical axis, a target position for correction based on a result of detection at each of the plurality of points changes in a scanning direction depending on a position of each of the plurality of points.

According to yet another aspect of the present invention, a position detection device for detecting position information of a photosensitive substrate when performing projection exposure of a pattern on a surface of an object onto the photosensitive substrate via a projection optical system by scanning the pattern includes detection means for detecting the position information within a shot region of the photosensitive substrate in the projection optical system, and means for causing the detection means to detect the position information at a plurality of points arranged so that a first end of the plurality of points coincides with a position to start a scanning exposure and a second end of the plurality of points coincides with a position to end the scanning exposure in accordance with a size of the shot region.

In one embodiment, the position information comprises a position in a direction of an optical axis of the projection optical system.

In another embodiment, the position information comprises alignment error of the photosensitive substrate with respect to the object.

In still another embodiment, each of the plurality of points comprises a position where an alignment mark is formed on the photosensitive substrate.

According to yet a further aspect of the present invention, a position detection device for detecting position information of a photosensitive substrate, when performing projection exposure of a pattern on a surface of an object onto the photosensitive substrate via a projection optical system by scanning the pattern, includes a projection optical system for projecting light onto the photosensitive substrate, a receiving optical system for receiving light from the photosensitive substrate, and a stage for mounting the photosensitive substrate. A relationship between a movement of the stage and a detection position determined by the projection optical system and the receiving optical system is provided so as to be able to detect the position information at a plurality of points whose first end coincides with a position to start a scanning exposure and whose second end coincides with a position to end the scanning exposure on the photosensitive substrate.

According to still another aspect of the present invention, a wafer whose surface is subjected to projection exposure via a projection optical system by scanning a pattern on a surface of a reticle includes a plurality of alignment marks whose first end is arranged to coincide with a position to start a scanning exposure and whose second end is arranged to coincide with a position to end the scanning exposure in accordance with a size of each shot region.

According to still another aspect of the present invention, a device manufacturing method for manufacturing devices by performing projection exposure of a pattern on a surface of an object onto a photosensitive substrate via a projection optical system by scanning the pattern followed by a developing process includes the steps of detecting surface-position information at a plurality of points whose first end is arranged to coincide with a position to start the scanning exposure and whose second end is arranged to coincide with a position to start the scanning exposure in accordance with a size of a shot region within the photosensitive substrate, positioning the photosensitive substrate using the surface-position information, and exposing the photosensitive substrate which provides devices.

In one embodiment, an interval between adjacent points of the plurality of points is variable in accordance with a length of the scanning exposure in each shot region of the photosensitive substrate.

In another embodiment, the plurality of points are arranged with a substantially equal interval making the position to start the scanning exposure substantially equivalent to the first end and the position to end the scanning exposure substantially equivalent to the second end.

In still another embodiment, a size of the shot region s individually obtained in advance for each shot region from layout information of a region to be exposed on the photosensitive substrate.

In yet another embodiment, a position of the shot region being subjected to projection exposure in the direction of an optical axis of the projection optical system is corrected based on the surface-position information.

In yet a further embodiment, in the correction of the position of the shot region in the direction of the optical axis, a target position for correction based on a result of detection at each of the plurality of points changes in a scanning direction depending on a position of each of the plurality of points.

According to still another aspect of the present invention, a device manufacturing method for manufacturing devices by performing projection exposure of a pattern on a surface of a reticle onto a wafer, via a projection optical system by scanning the pattern followed by a developing process includes the steps of detecting surface-position information at a plurality of points whose first end is arranged to coincide with a position to start the scanning exposure and whose second end is arranged to coincide with a position to end the scanning exposure in accordance with a size of a shot region within the photosensitive substrate, positioning the photosensitive substrate using the surface-position information, and exposing the wafer which provides devices.

In one embodiment, an interval between adjacent points of the plurality of points is variable in accordance with a length of the scanning exposure in each shot region of the photosensitive substrate.

In another embodiment, the plurality of points are arranged with a substantially equal interval making the position to start the scanning exposure substantilly equivalent to the first end and the position to end the scanning exposure substantially equivalent to the second end.

In still another embodiment, a size of the shot region is individually obtained in advance for each shot region from layout information of a region to be exposed on the photosensitive substrate.

According to still another aspect of the present invention, a device manufacturing method for manufacturing devices by performing projection exposure of a pattern on a surface of an object onto a photosensitive substrate via a projection optical system by scanning the pattern followed by a developing process includes the steps of detecting position information at a plurality of points whose first end is arranged to coincide with a position to start the scanning exposure and whose second end is arranged to coincide with a position to end the scanning exposure in accordance with a size of a shot region within the photosensitive substrate, positioning the photosensitive substrate using the position information, and exposing the photosensitive substrate which provides devices.

In one embodiment, the position information comprises a position in a direction of an optical axis of the projection optical system.

In another embodiment, the position information comprises alignment error of the photosensitive substrate with respect to the surface of the object.

In still another embodiment, each of the plurality of points comprises a position where an alignment mark is formed on the photosensitive substrate.

The foregoing and other objects, advantages, and features of the present invention will become more apparent from the following description of the preferred embodiments taken in conjunction with the accompanying drawings.

BRIEF DESCRIPTION OF THE DRAWINGS

FIG. 3A illustrates a state in a shot 100 near the center of the wafer shown in FIG. 2; and FIG. 3B illustrates a state in a shot 110 at a surrounding portion of the wafer shown in FIG. 2;

FIGS. 5A through 5E are diagrams illustrating a correction method during exposure;

FIGS. 6A, 6B, and 6C are diagrams illustrating a second embodiment of the present invention.

DESCRIPTION OF THE PREFERRED EMBODIMENTS

Figure 1:
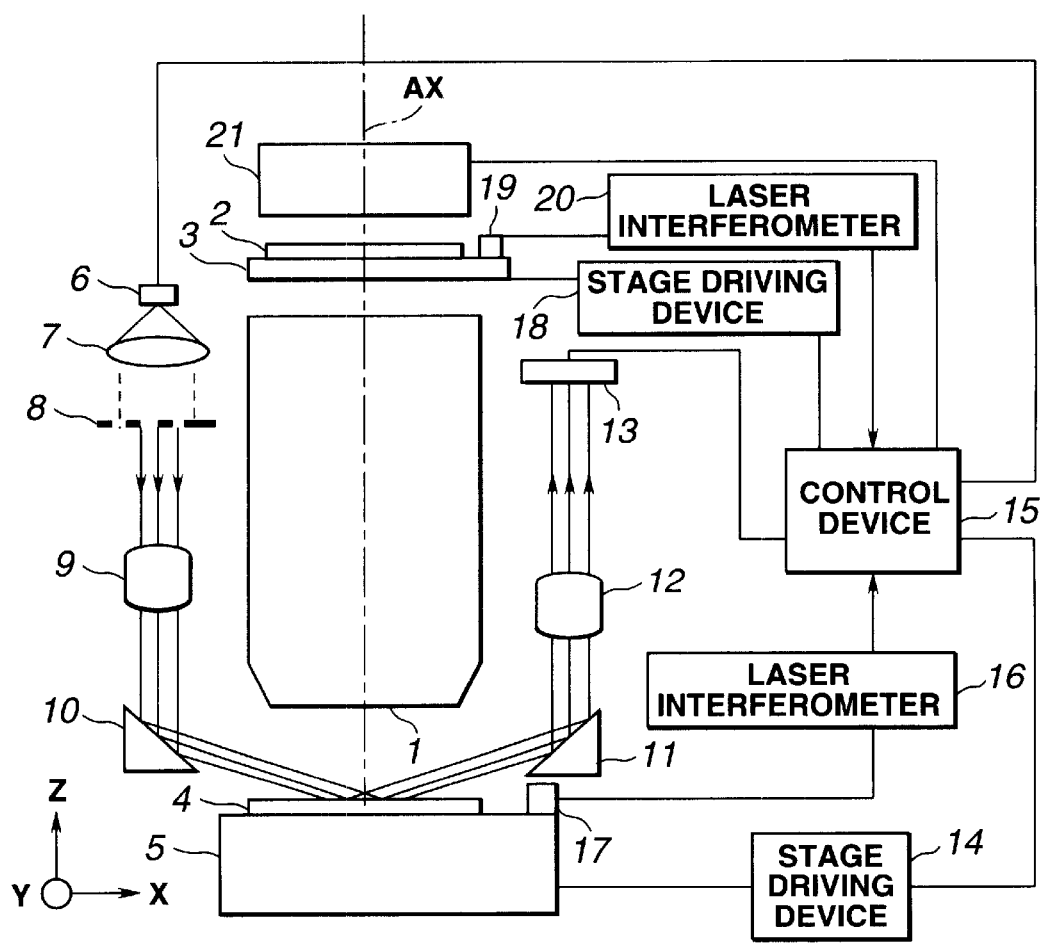
FIG. 1 is a schematic diagram illustrating a principal portion of a slit-scanning exposure apparatus including a surface-position detection device according to a first embodiment of the present invention.

FIG. 1 is a schematic diagram illustrating a principal portion of a reduction projection exposure apparatus (according to a step-and-repeat method or a step-and-scan methods including a surface-position detection device according to a first embodiment of the present invention.

In FIG. 1, a reduction projection lens system projection optical system) 1 has an optical axis AX. The reduction projection lens system 1 projects a circuit patern formed on a reticle 2, for example, by reducing to ⅕, and forms an image of the circuit pattern on its focal plane. The optical axis AX is parallel to the z-axis direction shown in FIG. 1.

A reticle stage 3 is horizontally movable in the y-axis direction while holding the reticle 2, and is rotatable around an axis parallel to the z-axis direction.

A resist is coated on a surface of a wafer (object) 4. A large number of exposed regions (shots) having the same pattern formed thereon in the above-described exposure process are arranged on the surface of the wafer 4. A wafer stage 5 is used for mounting the wafer 4. The wafer 4 is attracted to and fixed on the wafer stage 5. The wafer stage 5 includes an XY stage horizontally movable in the x-axis direction and the y-axis direction, a leveling stage rotatable around the z-axis direction and axes parallel to the x-axis and y-axis directions, and a rotating stage rotatable around an axis parallel to the z-axis direction. The x-axis, y-axis and z-axis directions are orthogonal to one another.

Accordingly, by driving the wafer stage 5, a position on the surface of the wafer 4 is adjusted in the direction of the optical axis AX of the reduction projection lens system 1 and along a plane perpendicular to the optical axis AX, and the focal plane, i.e., inclination with respect to the image of the circuit pattern, is also adjusted.

The movement of the reticle stage 3 is controlled by a stage driving device 18, and the movement of the wafer stage is controlled by a stage driving device 14.

The stage driving device 18 includes means for adjusting the position (y) and the rotation (θ) of the reticle 2 on a plane perpendicular to the optical axis AX. The stage driving device 14 includes means for adjusting the position (x,y) and the rotation (θ) of the wafer 4 on a plane perpendicular to the optical axis AX, and means for adjusting the position (z) and the inclination (α, β) of the wafer 4 in the direction of the optical axis AX. The stage driving devices 18 and 14 receive respective instruction signals from the control device 15 via corresponding signal lines, and perform servo driving of the reticle stage 3 and the wafer stage 5, respectively, in response to the corresponding signals.

The control device 15 also controls a light source 6, a two-dimensional-position detection device 13 and an exposure light source 21 in addition to the stage driving devices 14 and 18 by transmitting respective independent instruction signals via corresponding signal lines.

Reference numerals 6–13 shown in FIG. 1 represent components of surface-position detection means including an obliquely incident, optical system provided for detecting surface-position information with respect to the surface position, inclination, and the like of the wafer 4. Reference numeral 6 represents a high-brightness illuminating light source, such as a light-emitting diode, a semiconductor laser, or the like. Reference numeral 7 represents an illuminating lens.

Light emitted from the light source 6 becomes a parallel light beam by the illuminating lens 7, and illuminates an aperture mask (hereinafter abbreviated as a "mask") 8 having a plurality of pinholes formed therein. A plurality of spot light beams obtained from the light beam passing through the respective pinholes of the mask 8 is incident, upon a deflecting mirror 10 after passing through an imaging lens 9. The deflecting mirror 10 then changes their directions such that the plurality of spot, light beams are incident upon the surface of the wafer 4. At that time, a plurality of locations including a central portion (on the optical axis of the projection optical system 1) of the exposed region of the wafer 4 is illuminated by the plurality of corresponding spot light beams passing through the mask In the first embodiment, images of the plurality of pinholes of the mask 8 are formed on a plurality of corresponding portions within an exposed region of the wafer 4 by the imaging lens 9 and the deflecting mirror 10. Light beams passing through the plurality of pin holes of the mask 8 are projected onto and reflected from the plurality of corresponding portions including a central portion of the exposed region of the wafer 4.

That is, in the first embodiment, a plurality of pinholes are formed in the mask 8, and position information relating to a plurality of corresponding measuring points including a central portion within the exposed region is measured.

The directions of the light beams reflected from the respective measuring points on the wafer 4 are changed by the deflecting mirror 11, and the deflected light beams are incident upon the position detection device 13, in which photosensors are two-dimensionally arranged, via a detection lens 12. The detection lens 12 forms the images of the pinholes of the mask 8 onto the position detection device 13 in cooperation with the imaging lens 9, the deflecting mirror 10, the wafer 4, and a deflecting mirror 11.

In other words, the mask 8 and the position detection device 13 for the wafer 4 are optically conjugate with each other. Although not schematically depicted in FIG. 1, a plurality of position detection devices 13 may be individually provided for the respective pinholes if it is difficult to provide a single position detection device 13 from the viewpoint of optical arrangement.

The position detection device 13 comprises, for example, a two-dimensional CCD (charge-coupled device), a line sensor, or the like, so as to be able to independently detect incident positions of the plurality of light beams passing through the plurality of corresponding pinholes on the photosensing surface of the position detection device 13.

A change in the position of the wafer 4 in the direction of the optical axis AX of the reduction projection lens system 1 can be detected as a deviation in incident positions of the plurality of light beams on the position detection device 13. Hence, the positions of the surface of the wafer 4 in the direction of the optical axis AX at the plurality of measuring points within the exposed region on the wafer 4 can be detected based on an output signal from the position detection device 13. The output signal from the position detection device 13 is input to the control device 15 which determines surface-position data for each measuring point.

The displacement of the wafer stage 5 in the x-axis and y-axis directions is measured by a well-known method using a reference mirror 17 and a laser interferometer 16 provided on the wafer stage 5, and a signal indicating the amount of displacement of the wafer stage 5 is input from the laser interferometer 16 to the control device 15 via a signal line. The movement of the wafer stage 5 is controlled by the stage driving device (driving device) 14. The stage driving device 14 receives an instruction signal from the control device 15, and peforms servo driving of the wafer stage 5 in response to the instruction signal.

In the first embodiment, the components 6 through 10 constitute light projection means, and the components 11 through 13 constitute light receiving means.

The control device 15 operates the light source 6 while the wafer stage is moving, based on the amount of displacement of the wafer stage 5 in the x-axis and y-axis directions, so as to start emission of a light beam. After the region to be exposed on the wafer 4 has been fed to a target position to be aligned with the reticle pattern in the optical axis AX of the reduction projection lens system 1, the control device 15 processes the output signal of the position detection device 13 (surface-position data) by a known method in order to detect the position of the surface of the wafer 4.

Next, a description will be provided of a slit-scan-type exposure system in the first embodiment.

As shown in FIG. 1, the reticle stage 3 holding the reticle 2 is scanned at a constant speed in the y-axis direction shown in FIG. 1 within a plane perpendicular to the direction of the optical axis AX of the reduction projection lens system 1. The position information of the reticle stage 3 in the y-axis direction has been measured according to a well-known method using a Y-bar mirror 19 fixed on the reticle stage 3 and a laser interferometer 20.

The control device 15 controls the entire system so as to perform scanning exposure of a slit image of the reticle 2 onto a predetermined region of the wafer 4 by adjusting the position on a plane perpendicular to the optical axis AX (the x and y positions, and the rotation θ around an axis parallel to the z axis) and the position in the z-direction (the rotations α and β around axes parallel to the x and y axes, respectively, and the height z on the z axis).

Alignment with the reticle pattern on the XY plane is realized by calculating control data from position data obtained from the Y-bar mirror 19 provided on the reticle stage 3 and the laser interferometer 20, position data of the reference mirror 17 provided on the wafer stage 5 and the laser interferometer 16, and position data of the wafer obtained from an alignment microscope (not shown), and controlling the positions of the reticle 2 and the wafer 4 by the control device 15 via the stage driving devices 18 and 14, respectively.

When scanning the reticle stage 3 from back to front of the plane of FIG. 1, the wafer stage 5 is scanned from front to back of the plane of FIG. 1 at a speed corrected by the reduction ratio of the projection lens. Alignment of the reticle pattern in the z-axis direction, i.e., alignment with the image plane, is realized by calculating the inclinations of the scanning direction and the vertical direction, and the height in the direction of the optical axis AX by the control device 15 based on detection data of the surface-position detection system 6–13 for detecting surface-position data of the wafer 4, obtaining the amount of correction to the optimum position of the image plane at the exposure position, and continuously controlling the wafer stage 5 via the stage driving device 14.

Although in the first embodiment a two-dimensional position detection device is used as the position detection device 13, the same effects may also be obtained by arranging a plurality of one-dimensional position detection devices. Furthermore, the light source 6 is not limited to an LED.

A mechanism for adjusting the surface of the wafer 4 to the focal plane of the projection lens system 1 is not limited to a mechanism of moving the wafer stage in a z axis direction. For example, the focal distance of the projection lens system may be changed, or the projection lens system and the reticle may be relatively moved in the direction of the optical axis AX.

Next, a surface-position detection method for continuously detecting the height of the wafer 4 by performing relative scanning by the surface-position detection system 6–13 in the first embodiment will be more specifically described with reference to FIGS. 2–4.

Figure 2:
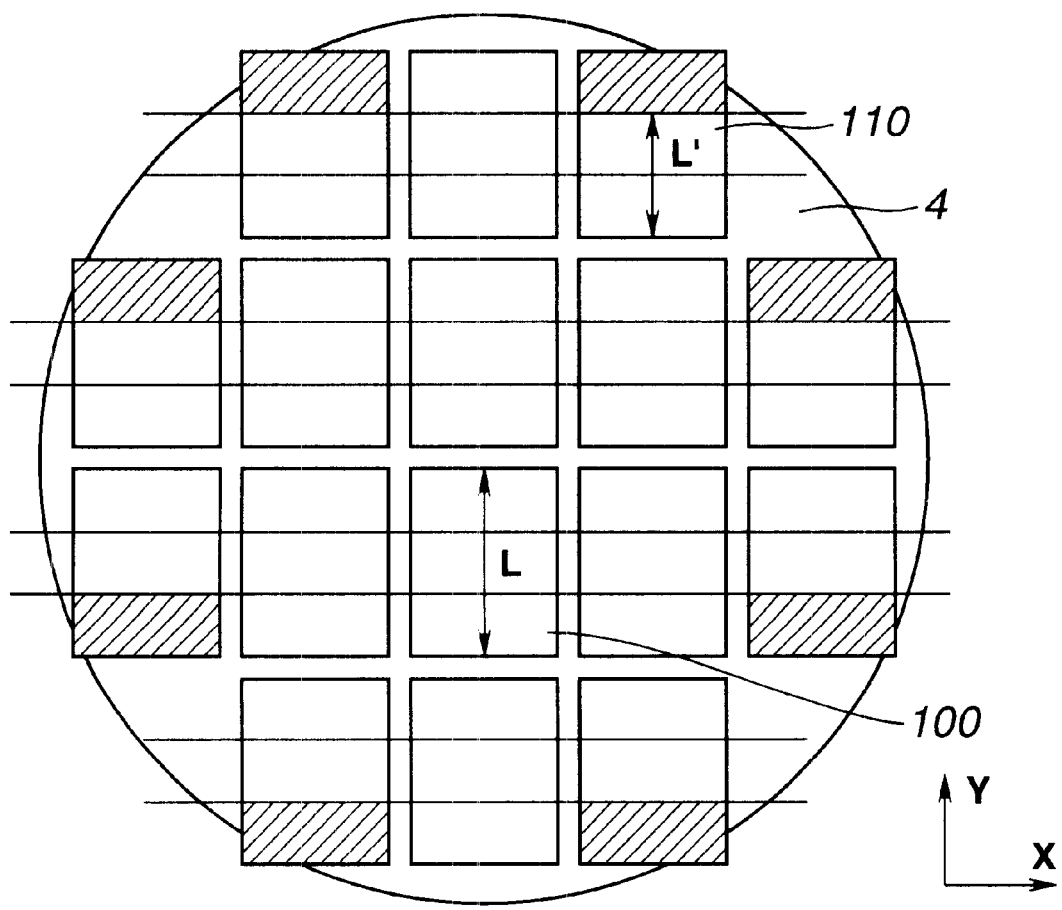
FIG. 2 is a plan view illustrating a state of arrangement of regions to be exposed (shots) on a wafer.
Figure 3A:
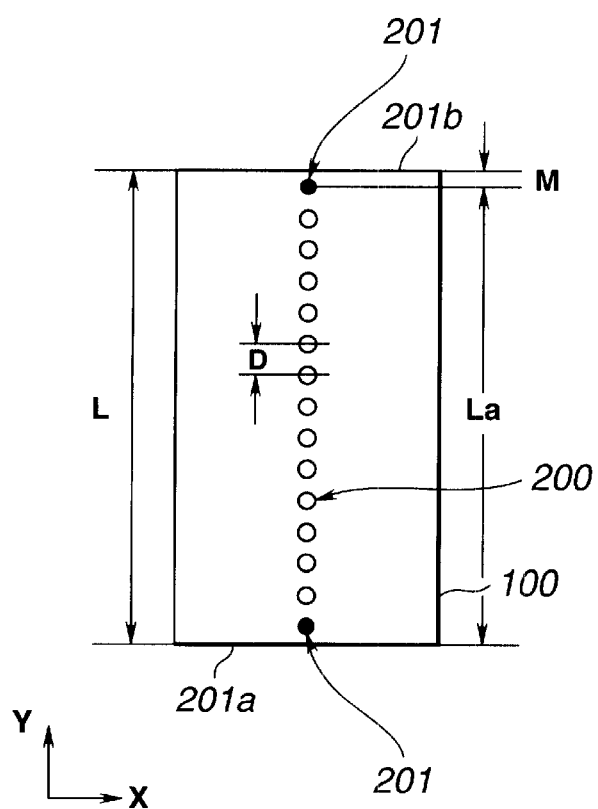
FIGS. 3A and 3B are diagrams illustrating an example of an arrangement of focus measuring points.
Figure 3B:
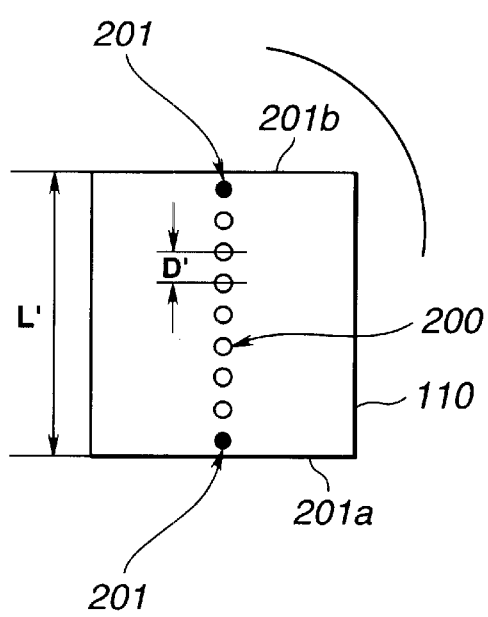

FIG. 2 is a plan view illustrating a state of arrangement of shots on the wafer 4. FIGS. 3A and 3B illustrate examples of arrangements of focus measuring points in the present invention. FIG. 4 illustrates a conventional approach in which a minimum sampling pitch is obtained from the detection region of the measuring system, the control frequency of the control system, and the like, and focus measuring points are arranged from a position to start a shot with a fixed pitch equal to an integer multiple of the minimum sampling pitch.

Figure 4:
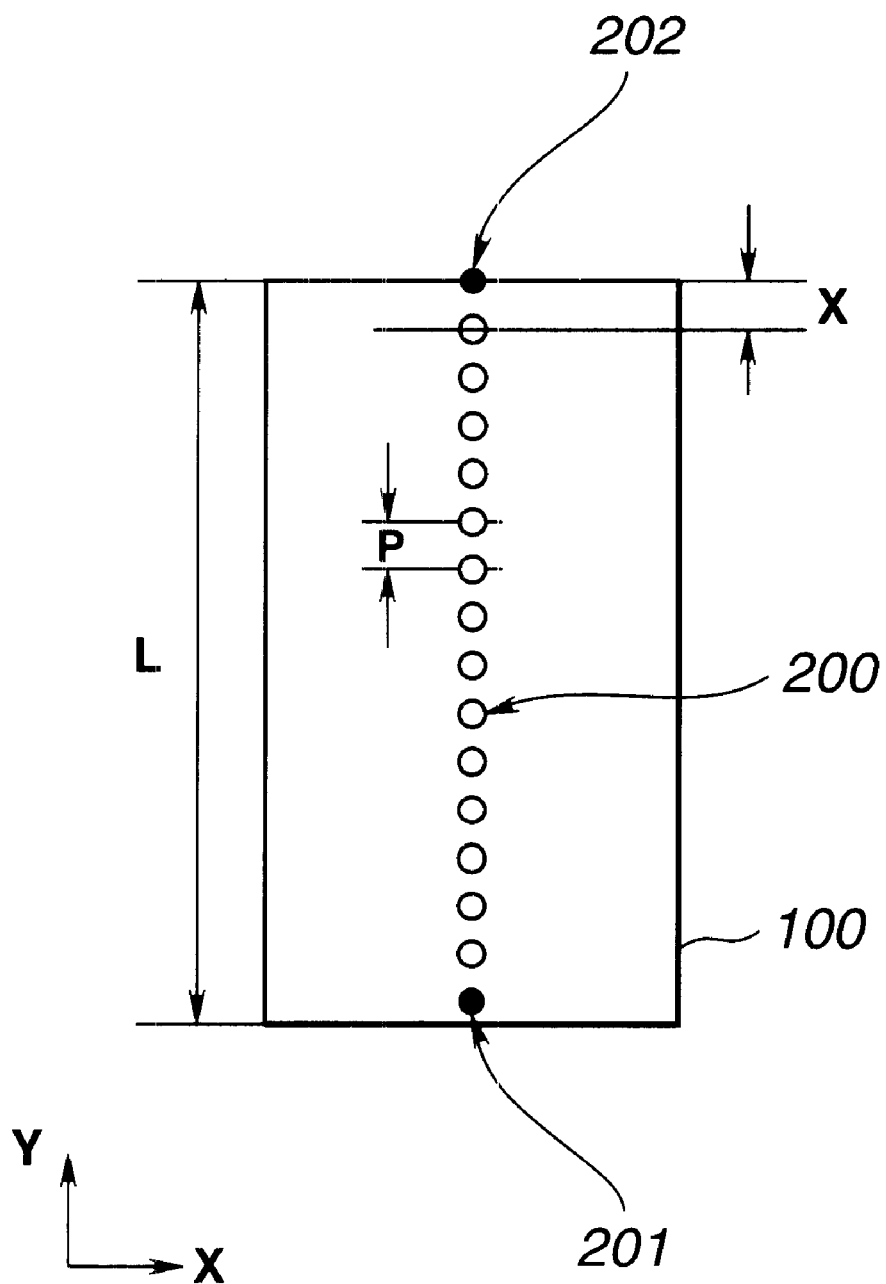
FIG. 4 is a diagram illustrating a conventional arrangement of measuring points set with a pitch equal to an integer multiple of a control frequency in the shot 100.

In FIGS. 3A, 3B, and 4, reference numeral 200 represents a focus detection point. A plurality of focus detection points 200 are present in the scanning direction Y. One point 200 corresponds to a region detected by the surface-position detection means 6–13 shown in FIG. 1.

Reference numeral 201 represents a sampling point provided at an end of each shot. Reference numeral 202 represents a sampling point provided on a scribing line. Reference numeral 201a represents a position to start scanning exposure, and reference numeral 201b represents a position to end scanning exposure.

First, an example of an arrangement of measuring points on a shot 100 near the center of the wafer 4 shown in FIG. 2 will be described.

A minimum sampling pitch P for the arrangement of the measuring points is determined from the detection region, i.e., the so-called equalizing region, of the measuring sensor, the speed of synchronizing scanning during exposure, the sampling period of the focus detection system corresponding to the residual vibration mode of the structure of the apparatus, the control frequency of the control system, and the like.

An equidistant sampling pitch D is set so as to provide a sampling interval larger than the minimum sampling pitch P for the remaining scanning length La obtained by subtracting a margin M necessary and sufficient in consideration of the averaging effect of the sensor when obtaining height information within a chip at a position to start exposure and a position to end exposure from a scanning exposure length L of the concerned shot 100.

The scanning exposure length L is calcuated for each exposure shot from the size of the wafer, the size of one shot, and the state of arrangement of regions to be exposed on the wafer formed from information relating to the chip configuration within one shot, i.e., layout information as shown in FIG. 2.

For example, if the number of sampling points within the concerned shot 100 is represented by K, a margin M of 0.6 mm is provided at each end of the shot for a scanning length L of 33 mm, and a minimum sampling pitch P of 2 mm is set., the number of sampling points in the case of a fixed pitch in the conventional approach shown in FIG. 4 is:

$$(33-(0.6\times 2)\div 2=15.9,$$

so that an information loss occurs in a region X having a maximum length of 2×0.9=1.8 (mm) at the position to end exposure.

In the present invention, however, if the sampling pitch D is determined from $$K=INT((L-M\times 2)-P),$$

where a numeral after the decimal point is rounded down in INT( ), and $$D=(L-M\times 2)\div K$$

as $$K=(INT(33-0.6\times 2)\div 2=15$$

$$D = (33 - 0.6 \times 2) \div 15$$

$$= 2.12 \text{ (mm)},$$

surface-position information within the shot can be accurately obtained over the entire region as shown in FIG. 3A.

A correction method at each measuring point during exposure will now be described with reference to FIGS. 5A–5E, which schematically depict each step in a side view. A case of seven measuring points 200 (represented by P1–P7) within a shot will be described. In scanning exposure, in contrast to conventional still exposure, the entire surface corresponding to an exposure slit 300 is exposed in the scanning direction in regions other than end points.

In other words, the position of the exposure slit, serving as a target position for correction, differs between points to start/end exposure and other positions. Accordingly, the following control is performed in the first embodiment. At the point to start exposure 201a, the point to be first measured from among the measuring points 200 (the first measuring point P1) is subjected to correction driving to the position of the exposure image surface (the center of depth) of a start end S of the exposure slit (S-1), and is controlled along the image surface until the second measuring point P2 enters the exposure region. When the second measuring point P2 has entered the exposure region, the direction of control is gradually changed so that the measuring point P2 is at the position of the height of the center of the exposure image surface at the center of the exposure slit in the scanning direction (S-2).

Thereafter, as shown in (S-2) and (S-3), the direction of control is gradually changed so that the measuring point is at the position of the height of the center of the exposure image surface at the center of the exposure slit in the scanning direction, until the seventh measuring point P7 at the point to end exposure reaches the center of the exposure slit in the scanning direction. When the seventh measuring point P7 at the point to end exposure passes through the center of the exposure slit in the scanning direction (S-4), control is switched as shown in (S-4) and (S-5) so that the point to end exposure 201b is scanned along the image surface (the center of depth) because there is no succeeding measuring point.

That is, by taking into consideration the exposure-slit ends S and E at the point to start exposure and the point to end exposure, respectively, it is possible to control the entire surface of a shot to an optimum image surface.

Although, in the first embodiment, point focusing at each point is performed, control may be performed so that a mean value of exposure regions is used for an exposure-slit region in accordance with the exposure region at each control timing.

More specifically, in control of a state of exposure in (S-2), control is performed so that the average height of the measuring points P1 and P2 coincides with the position of the exposure image surface at a position M1 within the slit in the scanning direction, and in control of a state of exposure in (S-3), control is performed so that the average height of the measuring points P3, P4, and P5 coincides with the position of the exposure image surface at a central position M2 of the slit. Similarly, in control of a state of exposure in (S-4), control is performed so that the average height of the measuring points P6 and P7 coincides with the position of the exposure image surface at a position M3 within the slit in the scanning direction.

Next, a description will be provided of a second embodiment of the present invention. An example of an arrangement of measuring points in a shot 110 at a surrounding portion of the wafer shown in FIG. 2 will be described.

The number of chips produced during one scanning operation in production facilities is usually two or three, and, in some cases, four to six in reduction projection. In such cases, when performing exposure in units of a shot comprising a plurality of chips on a round wafer, the scanning length L for a shot at a surrounding portion of the wafer is $$(n-1)/n : 1/n \, (n \geq 2)$$

when compared with a shot at a central portion of the wafer, where n is the number of shots.

Even if the sampling interval described in the first embodiment is adopted, for example, when scanning a $2/3$ region in 3-chip arrangement, the number of sampling points is:

$$(33 \times 2/3 - (0.6 \times 2)) \div 2.12 = 9.81.$$

Hence, an information loss occurs within a region having a maximum width of $2.12 \times 0.81 = 1.7$ (mm) at the position to end exposure.

In such a case, however, according to $$K = INT(L' - M \times 2) \div P,$$

where a numeral after the decimal point is rounded down in INT( ), and $$D' = (L' - M \times 2) \div K,$$

the sampling pitch is obtained as:

$$K = (INT(33 \times 2/3 - 0.6 \times 2) \div 2.12 = 9$$

$$D' = (33 \times 2/3 - 0.6 \times 2) \div 9 = 2.31 \text{ (mm)}.$$

By thus setting an equidistant sampling pitch D' of 2.31 (mm), surface-position information within the shot can be obtained over the entire region.

The present invention is not limited to the abovedescribed embodiments. For example, inclination information may be measured simultaneously with height information at each sampling point.

The present invention is also effective in an arrangement of alignment marks in scanning exposure. That is, when performing exposure having an accuracy equal to or smaller than 0.10 μm, it is necessary to make accurate changes in alignment equal to or smaller than 20 nm, and to sequentially measure and to correct alignment error within a shot due, for example, to vibration, variations in magnification, or the like.

For that purpose, for example, as shown in FIG. 6A, alignment marks 301 may be provided around a shot with a constant pitch in the scanning direction, and may be sequentially read and measured during scanning exposure in order to correct misalignment. In such a case, as shown in FIG. 6B, when the size of the shot is small, it becomes impossible to sequentially measure error in the entire shot area, and a region where data is uncertain is present at the front and rear ends of the shot such that, for example, an information loss occurs at a portion near the position to end exposure having a maximum width equal to the interval between marks, resulting in unstable control.

In this case, as shown in FIG. 6C, by adopting an arrangement of alignment marks in which the front and rear ends of a shot are considered, and executing the above-described sequential measurement with this arrangement, appropriate measurement sampling and appropriate control can be performed. The alignment marks may be read, for example, using a well-known TTL (through-the-lens) alignment optical system.

Next, a description will be provided of a method of manufacturing semiconductor devices by utilizing the abovedescribed projection exposure apparatus.

Figure 7:
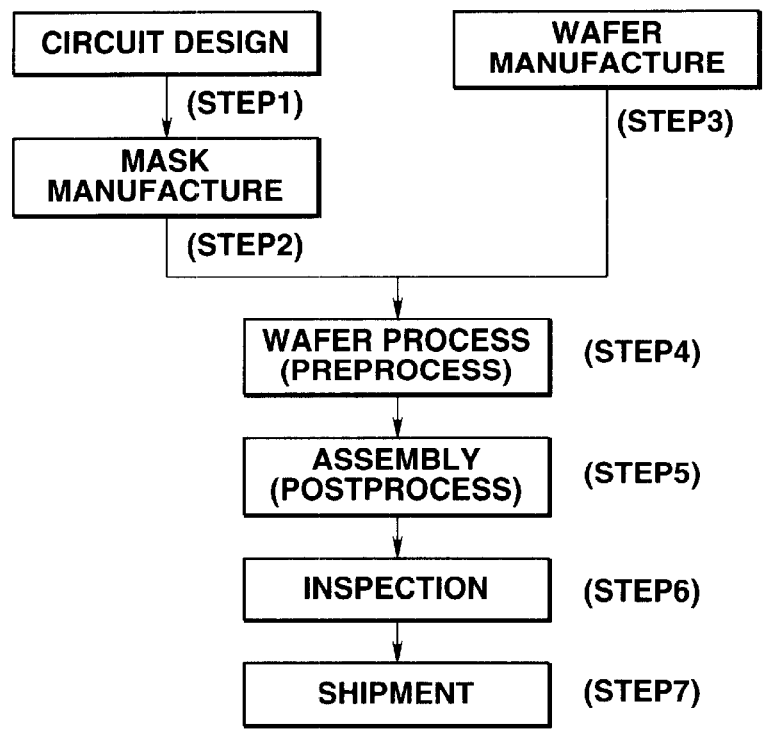
FIGS. 7 and 8 are flowcharts illustrating a device manufacturing method according to the present invention.

FIG. 7 is a flowchart of a method of manufacturing semiconductor devices (e.g., semiconductor chips of IC's (integrated circuits), LSI's or the like, liquid-crystal panels, CCD's (charge-coupled devices) or the like).

In step 1 (circuit design), a circuit design of semiconductor devices is performed. In step 2 (mask manufacture), masks, on which designed circuit patterns are formed, are manufactured.

In step 3 (wafer manufacture), wafers are manufactured using a material, such as silicon or the like. Step 4 (wafer process) is called a preprocess, in which actual circuits are formed on the wafers by means of photolithography using the above-described masks and wafers.

The next step, step 5 (assembly) is called a postprocess which manufactures semiconductor chips using the wafers manufactured in step 4, and includes an assembling process (dicing and bonding), a packaging process (chip encapsulation), and the like.

In step 6 (inspection), inspection operations, such as operation-confirming tests, durability tests, and the like, of the semiconductor devices manufactured in step 5 are performed. The manufacture of semiconductor devices is completed after passing through the above-described processes, and the manufactured devices are shipped (step 7).

Figure 8:
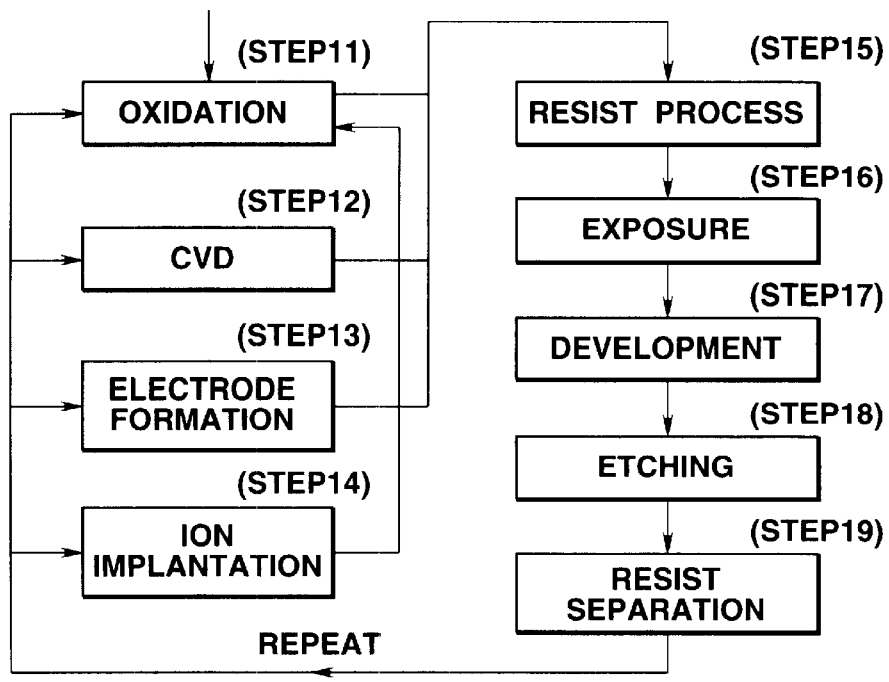

FIG. 8 is a detailed flow diagram of the abovedescribed wafer process. In step 11 (oxidation), the surface of the wafer is oxidized. In step 12 (CVD (chemical vapor deposition)), an insulating film is formed on the surface of the wafer.

In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16 (exposure), the circuit pattern on the mask is exposed and printed on the wafer using the above-described exposure apparatus.

In step 17 (development), the exposed wafer is developed. In step 18 (etching), portions other than the developed resist image are etched off. In step 19 (resist separation), the resist, which becomes unnecessary after the completion of the etching, is removed. By repeating these steps, a final circuit pattern made of multiple patterns is formed on the wafer.

By using the above-described manufacturing method, it is possible to manufacture semiconductor devices with a high degree of integration which have previously been difficult to manufacture.

As described above, according to the present invention, when continuously detecting the height of a wafer (or alignment error) while relatively scanning the wafer, by arranging points for detecting surface positions (or alignment error), i.e., so-called focus (or alignment error) measuring points, so that both ends of the points coincide with the position to start scanning exposure and the position to end scanning exposure in each shot in accordance with the size of the shot, it is possible to provide a surface-position detection device and a scanning projection exposure apparatus using the device suitable for manufacturing devices, in which a wafer can be very precisely adjusted to the focal plane of a projection optical system, irrespective of the size of the shot.

Particularly, according to the present invention, in chips having various sizes produced using reduction plates, cut-down plates, and the like, because various finer chips are demanded, it is possible to always perform excellent surface-position detection and/or correction (or alignment detection/correction) over the entire exposed region.

The individual components shown in outline form or designated by blocks in the drawings are all well known in the surface-position detection device and projection exposure apparatus arts and their specific construction and operation are not critical to the operation or the best mode for carrying out the invention.

While the present invention has been described with respect to what are at present considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A surface-position detection device for detecting surface-position information of a photosensitive substrate disposed near an imaging surface of a projection optical system when performing projection exposure of a pattern on a surface of an object onto the photosensitive substrate, via the projection optical system, by performing relative scanning between the photosensitive substrate and the object, said device comprising:

detection means for detecting the surface-position information within a shot region of the photosensitive substrate in a direction of an optical axis of the projection optical system; and means for causing said detection means to detect the surface-position information at a plurality of points arranged so that a first end of the plurality of points coincides with a position to start a scanning exposure and a second end of the plurality of points coincides with a position to end the scanning exposure, in accordance with a size of the shot region.

2. A device according to claim 1, wherein an interval between adjacent, points of the plurality of points is variable in accordance with a length of the scanning exposure in each shot region of the photosensitive substrate.

3. A device according to claim 1, wherein the plurality of points is arranged with a substantially equal interval making the position to start the scanning exposure substantially equivalent to the first end and the position to end the scanning exposure substantially equivalent to the second end.

4. A device according to claim 1, wherein a size of the shot region is individually obtained in advance for each shot region from layout information of a region to be exposed on the photosensitive substrate.

5. A surface-position detection device for detecting surface-position information of a wafer when performing projection exposure of a pattern on a surface of a reticle onto the wafer, via a projection optical system, by performing relative scanning between the wafer and the reticle, said device comprising:

detection means for continuously detecting the surface-position information within a shot region of the wafer in a direction of an optical axis of the projection optical system; and means for causing said detection means to detect the surface-position information at a plurality of points arranged so that a first end of the plurality of points coincides with a position to start a scanning exposure and a second end of the plurality of points coincides with a position to end the scanning exposure, in accordance with a size of the shot region.

6. A device according to claim 5, wherein the surface-position information comprises inclination of the wafer with respect to a plane perpendicular to the direction of the optical axis of the projection optical system.

7. A device according to claim 5, wherein an interval between adjacent points of the plurality of points is variable in accordance with a length of the scanning exposure in each shot region within the wafer.

8. A device according to claim 5, wherein the plurality of points is arranged with a substantially equal interval making the position to start the scanning exposure substantially equivalent to the first end and the position to end the scanning exposure substantially equivalent to the second end.

9. A device according to claim 5, wherein a size of the shot region is individually obtained in advance for each shot region from layout information of a region to be exposed on the wafer.

10. A scanning projection exposure apparatus for performing projection exposure of a pattern on a surface of an object onto a shot region on a surface of a photosensitive substrate mounted on a movable stage, by a projection optical system, while causing scanning means to perform scanning between the object and the movable stage, by causing the object and the movable stage to be synchronized with a velocity ratio corresponding to a photographing magnification of the projection optical system, said apparatus comprising:

detection means for detecting surface-position information within a shot region of the photosensitive substrate in a direction of an optical axis of the projection optical system; and means for causing said detection means to detect the surface-position information at a plurality of points arranged so that a first end of the plurality of points coincides with a position to start a scanning exposure and a second end of the plurality of points coincides with a position to end the scanning exposure in accordance with a size of the shot region.

11. An apparatus according to claim 10, wherein an interval between adjacent points of the plurality of points is variable in accordance with a length of the scanning exposure in each shot region of the photosensitive substrate.

12. An apparatus according to claim 10, wherein the plurality of points is arranged with a substantially equal interval, making the position to start the scanning exposure substantially equivalent to the first end and the position to end the scanning exposure substantially equivalent to the second end.

13. An apparatus according to claim 10, wherein a size of the shot region is individually obtained in advance for each shot region from layout information of a region to be exposed on the photosensitive substrate.

14. An apparatus according to claim 10, wherein a position of the shot region being subjected to projection exposure in the direction of the optical axis is corrected based on the surface-position information.

15. A position detection device for detecting position information of a photosensitive substrate when performing projection exposure of a pattern on a surface of an object onto the photosensitive substrate, via a projection optical system, by scanning the pattern, said device comprising:

detection means for detecting the position information within a shot region of the photosensitive substrate in the projection optical system; and means for causing said detection means to detect the position information at a plurality of points arranged so that a first end of the plurality of points coincides with a position to start a scanning exposure and a second end of the plurality of points coincides with a position to end the scanning exposure, in accordance with a size of the shot region.

16. A device according to claim 15, wherein the position information comprises a position in a direction of an optical axis of the projection optical system.

17. A device according to claim 15, wherein the position information comprises alignment error of the photosensitive substrate with respect to the object.

18. A device according to claim 15, wherein each of the plurality of points comprises a position where an alignment mark is formed on the photosensitive substrate.

19. A position detection device for detecting position information of a photosensitive substrate, when performing projection exposure of a pattern on a surface of an object onto the photosensitive substrate via a projection optical system by scanning the pattern, said device comprising:

a projection optical system for projecting light onto the photosensitive substrate;

a receiving optical system for receiving light from the photosensitive substrate; and a stage for mounting the photosensitive substrate, wherein a relationship between a movement of said stage and a detection position determined by said projection optical system and said receiving optical system is provided so as to be able to detect the position information at a plurality of points whose first end coincides with a position to start a scanning exposure and whose second end coincides with a position to end the scanning exposure on the photosensitive substrate.

20. A wafer whose surface is subjected to projection exposure, via a projection optical system, by scanning a pattern on a surface of a reticle, said wafer comprising:

a plurality of alignment marks whose first end is arranged to coincide with a position to start a scanning exposure and whose second end is arranged to coincide with a position to end the scanning exposure, in accordance with a size of each shot region.

21. A device manufacturing method for manufacturing devices by performing projection exposure of a pattern on surface of an object onto a photosensitive substrate via a projection optical system by scanning the pattern followed by a developing process, said method comprising the steps of:

detecting surface-position information at a plurality of points whose first end is arranged to coincide with a position to start a scanning exposure and whose second end is arranged to coincide with a position to end the scanning exposure, in accordance with the photosensitive substrate;

positioning the photosensitive substrate using the surface-position information; and exposing the photosensitive substrate.

22. A method according to claim 21, wherein an interval between adjacent points of the plurality of points is variable in accordance with a length of the scanning exposure in each shot region of the photosensitive substrate.

23. A method according to claim 21, wherein the plurality of points is arranged with a substantially equal interval making the position to start the scanning exposure substantially equivalent to the first end and the position to end the scanning exposure substantially equivalent to the second end.

24. A method according to claim 21, wherein a size of the shot region is individually obtained in advance for each shot region from layout information of a region to be exposed on the photosensitive substrate.

25. A method according to claim 21, wherein a position of the shot region being subjected to projection exposure in the direction of an optical axis of the projection optical system is corrected based on the surface-position information.

26. A method according to claim 21, wherein said positioning step occurs during said exposing step such that the exposed portion of the photosensitive substrate remains within the depth of field of the projection optical system.

27. A device manufacturing method for manufacturing devices by performing projection exposure of a pattern on a reticle onto a wafer, via a projection optical system, by scanning the pattern followed by a developing process, said method comprising the steps of:

detecting surface-position information at a plurality of points whose first end is arranged to coincide with a position to start a scanning exposure and whose second end is arranged to coincide with a position to end the scanning exposure in accordance with a size of a shot region within the photosensitive substrate;

positioning the photosensitive substrate using the surface-position information; and exposing the wafer.

28. A method according to claim 27, wherein an interval between adjacent points of the plurality of points is variable in accordance with a length of the scanning exposure in each shot region of the photosensitive substrate.

29. A method according to claim 27, wherein the plurality of points is arranged with a substantially equal interval making the position to start the scanning exposure substantially equivalent to the first end and the position to end the scanning exposure substantially equivalent to the second end.

30. A method according to claim 27, wherein a size of the shot region is individually obtained in advance for each shot region from layout information of a region to be exposed on the photosensitive substrate.

31. A method according to claim 27, wherein said positioning step occurs during said exposing step such that the exposed portion of the wafer remains within the depth of field of the projection optical system.

32. A device manufacturing method for manufacturing devices by performing projection exposure of a pattern on a surface of an object onto a photosensitive substrate, via a projection optical system, by scanning the pattern followed by a developing process, said method comprising the steps of:

detecting position information at a plurality of points whose first end is arranged to coincide with a position to start a scanning exposure and whose second end is arranged to coincide with a position to end the scanning exposure in accordance with a size of a shot region within the photosensitive substrate;

positioning the photosensitive substrate using the position information; and exposing the photosensitive substrate.

33. A method according to claim 32, wherein the position information comprises a position in a direction of an optical axis of the projection optical system.

34. A method according to claim 32, wherein the position information comprises alignment error of the photosensitive substrate with respect to the surface of the object.

35. A method according to claim 32, wherein each of the plurality of points comprises a position where an alignment mark is formed on the photosensitive substrate.

36. A method according to claim 32, wherein said positioning step occurs during said exposing step such that the exposed portion of the photosensitive substrate remains within the depth of field of the projection optical system.

37. A scanning projection exposure apparatus for performing projection exposure of a pattern on a surface of an object onto a shot region on a surface of a photosensitive substrate mounted on a movable stage, by a projection optical system, while causing scanning means to perform scanning between the object and the movable stage, by causing the object and the movable stage to be synchronized with a velocity ratio corresponding to a photographing magnification of the projection optical system, said apparatus comprising:

detection means for detecting surface-position information within a shot region of the photosensitive substrate in a direction of an optical axis of the projection optical system; and means for causing said detection means to detect the surface-position information at a plurality of points arranged so that a first end of the plurality of points coincides with a position to start a scanning exposure and a second end of the plurality of points coincides with a position to end the scanning exposure in accordance with a size of the shot region, wherein a position of the shot region being subjected to projection exposure in the direction of the optical axis is corrected based on the surface-position information, and wherein in the correction of the position of the shot region in the direction of the optical axis, a target position for correction based on a result of a detection at each of the plurality of points changes in a scanning direction depending on a position of each of the plurality of points.

38. A device manufacturing method for manufacturing devices by performing projection exposure of a pattern on a surface of an object onto a photosensitive substrate via a projection optical system by scanning the pattern followed by a developing process, said method comprising the steps of:

detecting surface-position information at a plurality of points whose first end is arranged to coincide with a position to start a scanning exposure and whose second end is arranged to coincide with a position to end the scanning exposure, in accordance with a size of a shot region within the photosensitive substrate;

positioning the photosensitive substrate using the surface-position information; and exposing the photosensitive substrate, wherein a position of the shot region being subjected to projection exposure in the direction of an optical axis of the projection optical system is corrected based on the surface-position information, and wherein, in the correction of the position of the shot region in the direction of the optical axis, a target position for correction based on a result of a detection at each of the plurality of points changes in a scanning direction depending on a position of each of the plurality of points.

39. A position detection device for detecting position information of a photosensitive substrate when performing projection exposure of a pattern on a surface of an object onto the photosensitive substrate, via a projection optical system, by performing relative scanning between the photosensitive substrate and the object, said device comprising:

detection means for detecting the position information at a plurality of points within a shot region of the photosensitive substrate; and means for causing said detection means to detect the position information at the plurality of points arranged in accordance with a size of the shot region.

40. A device according to claim 39, wherein the position information comprises a position in a direction of an optical axis of the projection optical system.

41. A device according to claim 39, wherein the position information comprises alignment error of the photosensitive substrate with respect to the object.

42. A scanning projection exposure apparatus for performing projection exposure of a pattern on a surface of an object onto a shot region on a surface of a photosensitive substrate, by a projection optical system, said apparatus comprising:

detection means for detecting the position information at a plurality of points within a shot region of the photosensitive substrate; and means for causing said detection means to detect the position information at the plurality of points arranged in accordance with a size of the shot region.

43. A device manufacturing method for manufacturing devices by performing projection exposure of a pattern on a reticle onto a wafer, via a projection optical system, by scanning the pattern following by a developing process, said method comprising the steps of:

detecting, with detection means, the position information at a plurality of points within a shot region of the photosensitive substrate; and causing the detection means to detect the position information at the plurality of points arranged in accordance with a size of the shot region.

44. An alignment device for aligning a photosensitive substrate when performing projection exposure of a pattern on a surface of an object into the photosensitive substrate, via a projection optical system, by performing relative scanning between the photosensitve substrate and the object, said device comprising:

alignment means for aligning the photosensitive substrate at a plurality of points within a shot region of the photosensitive substrate; and means for causing said alignment means to align the photosensitive substrate at a plurality of points arranged in accordance with a size of the shot region.

45. A device according to claim 44, further comprising detection means for detecting position information at a plurality of points within the shot region of the photosensitive substrate, wherein said alignment means aligns the photosensitive substrate based on a detection result of said detection means.

46. A device according to claim 44, wherein the position information comprises a position in a direction of an optical axis of the projection optical system.

47. A device according to claim 44, wherein the position information comprises alignment error of the photosensitive substrate with respect to the object.

48. A scanning projection exposure apparatus for performing projection exposure of a pattern on a surface of an object onto a shot region on a surface of a photosensitive substrate, by a projection optical system, said apparatus comprising:

alignment means for aligning the photosensitive substrate at a plurality of points within a shot region of the photosensitve substrate; and means for causing said alignment means to align the photosensitive substrate at a plurality of points arranged in accordance with a size of the shot region.

49. A device manufacturing method for manufacturing devices by performing projection exposure of a pattern on a reticle onto a wafer, via a projection optical system, by scanning the pattern following by a developing process, said method comprising the steps of:

aligning, with alignment means, the photosensitive substrate at a plurality of points within a shot region of the photosensitive substrate; and causing the alignment means to align the photosensitive substrate at a plurality of points arranged in accordance with a size of the shot region.

* * * * *

UNITED STATES PATENT AND TRADEMARK OFFICE
CERTIFICATE OF CORRECTION

PATENT NO.    : 6,426,508 B1
DATED         : July 30, 2002
INVENTOR(S)   : Yuji Kosugi et al.

It is certified that error appears in the above-identified patent and that said Letters Patent is hereby corrected as shown below:

Title page,
Item [*] Notice: insert -- This patent issued on a continued prosecution application filed under 37 CFR 1.53(d), and is subject to the twenty year patent term provision of 35 U.S.C. 154(a)(2). --

Column 5,
Line 6, "s" should read -- is --.

Column 6,
Line 38, "methods" should read -- method) --.
Line 40, "projection" should read -- (projection --.
Line 42, "patern" should read -- pattern --.

Column 7,
Line 38, "spot," should read -- spot --.
Line 48, "pin holes" should read -- pinholes --.

Column 10,
Line 25, "set.," should read -- set, --.

Column 12,
Lines 17 and 51, "abovedescribed" should read -- above-described --.

Column 13,
Line 9, "abovedescribed" should read -- above-described --.

Column 16,
Line 17, "first," should read -- first --.
Line 23, "on" should read -- on a --.

UNITED STATES PATENT AND TRADEMARK OFFICE
CERTIFICATE OF CORRECTION

PATENT NO.   : 6,426,508 B1
DATED        : July 30, 2002
INVENTOR(S)  : Yuji Kosugi et al.

It is certified that error appears in the above-identified patent and that said Letters Patent is hereby corrected as shown below:

Column 20,
Line 23, "pattern following" should read -- pattern, followed --.

Signed and Sealed this

Tenth Day of December, 2002

JAMES E. ROGAN
*Director of the United States Patent and Trademark Office*